US008755480B1

(12) United States Patent
Leong

(10) Patent No.: US 8,755,480 B1
(45) Date of Patent: Jun. 17, 2014

(54) INTEGRATED CIRCUIT (IC) CLOCKING TECHNIQUES

(75) Inventor: Han Hua Leong, Butterworth (MY)

(73) Assignee: Altera Corporation, San Jose, CA (US)

( * ) Notice: Subject to any disclaimer, the term of this patent is extended or adjusted under 35 U.S.C. 154(b) by 172 days.

(21) Appl. No.: 13/341,722

(22) Filed: Dec. 30, 2011

(51) Int. Cl.
*H03D 3/24* (2006.01)

(52) U.S. Cl.
USPC ........... 375/376; 375/373; 375/371; 375/354; 375/294; 375/293; 375/215

(58) Field of Classification Search
USPC .......... 375/376, 373, 371, 354, 294, 293, 215
See application file for complete search history.

(56) References Cited

U.S. PATENT DOCUMENTS

| | | | | |
|---|---|---|---|---|
| 5,087,829 A | * | 2/1992 | Ishibashi et al. | 327/152 |
| 5,373,254 A | * | 12/1994 | Nakauchi et al. | 331/1 A |
| 6,747,954 B1 | * | 6/2004 | Petersen et al. | 370/236 |
| 7,095,816 B2 | * | 8/2006 | Kishine et al. | 375/355 |
| 2004/0172570 A1 | * | 9/2004 | Miyajiri | 713/400 |
| 2009/0122939 A1 | * | 5/2009 | Hoang et al. | 375/375 |
| 2009/0232250 A1 | * | 9/2009 | Yamada et al. | 375/295 |

* cited by examiner

*Primary Examiner* — Kenneth Lam
(74) *Attorney, Agent, or Firm* — Womble Carlyle Sandridge & Rice LLP

(57) ABSTRACT

Circuits and techniques for operating an integrated circuit (IC) are disclosed. A disclosed circuit includes a divider circuit that is operable to receive a first signal at a first speed and output a second signal at a second speed based on the first signal. A recovery circuit is coupled to the divider circuit. The recovery circuit is operable to determine the frequency of the second signal and is further operable to generate a first ready signal and a recovered clock signal based on the second signal. A phase aligner circuit, operable to align a phase of the second signal with a phase of the recovered clocks signal based on the first ready signal, is coupled to the recovery circuit.

20 Claims, 5 Drawing Sheets

INTEGRATED CIRCUIT (IC) CLOCKING TECHNIQUES

BACKGROUND

Integrated circuits (ICs) are used in various applications and devices. Programmable circuits, e.g., field-programmable gate array (FPGA) devices, include logic blocks, generic structures and input/output structures that can be configured to perform any of a variety of functions and support different protocols. Devices may be coupled together or coupled to other components and communicate with one another through a master/slave configuration. As is generally known, a master/slave configuration is a system where one device is used to control one or more devices.

Generally, in order for the different components to communicate effectively, different reference clocks may be needed. For instance, a receiver that is coupled to receive a data stream with an embedded clock signal from a transceiver device may need a local reference clock. With two different clocks, possibly operating at different rates, the phase difference between the two clocks needs to be determined and the difference need to fall below the acceptable threshold, e.g., the frequency threshold, measured in parts per million (PPM), of the receiver.

For instance, the DisplayPort protocol may need two asynchronous clocks, i.e., one reference clock in the master device and another reference clock in the slave device. This creates a static clock rate difference between the two devices and may lead to higher jitter. Since there is a local reference clock source at the slave device, an additional phase-locked loop (PLL) circuit is required on the slave device. Dedicated clock pins may also be needed at the slave device to receive the clock signals from the local reference clock.

Other protocols, for instance the Peripheral Component Interconnect (PCI) Express protocol, may use a synchronized reference clock source. Therefore, there is no need for dedicated clock source on the slave device that is connected to a master device through such protocols. Compared to other protocols, e.g., Serial Advanced Technology Attachment (SATA), DisplayPort, etc., that use asynchronous clocks, protocols that use a synchronous clock has better jitter tolerance. However, the slave device requires dedicated clock pins to receive the synchronous clock input and a PLL circuit to adjust the phase of the synchronous clock at the slave device.

SUMMARY

Embodiments of the present invention include circuits and techniques for operating an integrated circuit (IC).

It is appreciated that the present invention can be implemented in numerous ways, such as a process, an apparatus, a system, a device or a method on a computer readable medium. Several inventive embodiments of the present invention are described below.

In one embodiment, a circuit is disclosed. The disclosed circuit includes a divider circuit that is operable to receive a first signal at a first speed and output a second signal at a second speed based on the first signal. A recovery circuit is coupled to the divider circuit. The recovery circuit is operable to determine the frequency of the second signal and is further operable to generate a first ready signal and a recovered clock signal based on the second signal. A phase aligner circuit, operable to align a phase of the second signal with a phase of the recovered clocks signal based on the first ready signal, is coupled to the recovery circuit.

In another embodiment, an IC is disclosed. The IC includes a divider circuit coupled to receive a preamble signal. The divider circuit is operable to output a first clock signal based on the preamble signal. A recovery circuit that is operable to determine a phase of the first clock signal is coupled to the divider circuit. The recovery circuit is further operable to output a second clock signal based on the first clock signal. An input terminal of a comparator circuit is coupled to the divider circuit. The comparator circuit is operable to output a phase difference between the first clock signal and a delayed version of the second clock signal. A delay circuit is coupled to the recovery circuit, the comparator circuit, and further coupled to receive the phase difference from the comparator circuit. The delay circuit is operable to output the delayed version of the second clock signal based on the phase difference, and is also operable to output a recovered clock signal based on the delayed version of the second clock signal.

In another embodiment, a method for operating an IC is disclosed. The method includes receiving a preamble signal at a first speed from an external component. The preamble signal is divided to generate a first signal at a second speed. A phase of a second signal, generated within a recovery circuit in the IC, is locked to a phase of the first signal to generate a third signal. A phase of the third signal is then aligned with the phase of the first signal and the IC is clocked with the aligned third signal.

Other aspects of the exemplary embodiments will become apparent from the following detailed description, taken in conjunction with the accompanying drawings, illustrating by way of example the principles of the embodiments.

BRIEF DESCRIPTION OF THE DRAWINGS

The exemplary embodiments may best be understood by reference to the following description taken in conjunction with the accompanying drawings.

DETAILED DESCRIPTION

The following embodiments describe circuits and techniques for operating an integrated circuit (IC).

It will be obvious, however, to one skilled in the art, that the present exemplary embodiments may be practiced without some or all of these specific details. In other instances, well-known operations have not been described in detail in order not to unnecessarily obscure the present embodiments.

Generally, an IC may be connected to an external component, e.g., a device, a circuit, another IC, etc., and signals may travel from the IC to the external component and vice versa. The IC and the external component that is connected to the IC may each operate at a different speed under different clock signals. For instance, in a master/slave configuration, the master device may have one reference clock and the slave component coupled to the master device may have another reference clock. The embodiments described herein provide techniques and circuits for operating an IC or a circuit that is coupled to receive signals from an external component without having an extra clock signal or an additional phase-locked loop (PLL) circuit. One of the embodiments describes circuitry that is operable to train the IC according to a reference clock rate from an external component, e.g., another IC, coupled to the IC. Once the IC is trained to operate at the reference clock rate, a two-way communication path can be established between the IC and the external component coupled to the IC, i.e., data signals can be transferred from the external component to the IC and vice versa.

Figure 1:
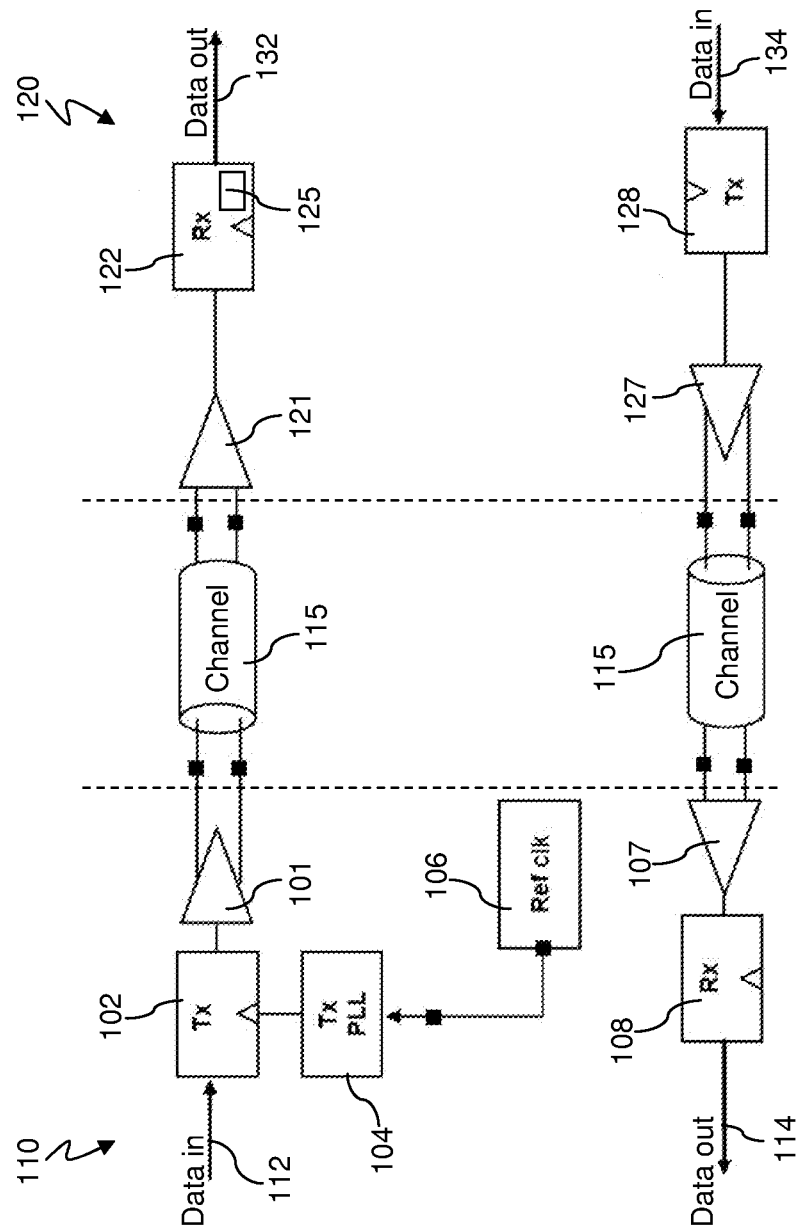
FIG. 1, meant to be illustrative and not limiting, shows a slave device coupled to a host device according to one embodiment of the present invention.

FIG. 1, meant to be illustrative and not limiting, shows a slave device 120 coupled to a host device 110 according to one embodiment of the present invention. Host device 110 includes a reference clock 106 and a PLL circuit 104 coupled to a transmitter circuit 102. Signals from host device travel from transmitter circuit 102 through output buffer 101 and interface channel 115 to slave device 120. It should be appreciated that host device 110 may be an IC and transmitter circuit 102 and receiver circuit 108 are part of a transceiver block on the IC. Slave device 120 may be an external component that is coupled master device 110. In the embodiment of FIG. 1, slave device 120 is another IC that is coupled to IC 110 through channel interface 115, e.g., a cable, antenna, etc.

Referring still to FIG. 1, data signals from other parts of IC 110 travel through connection 112 to transmitter circuit 102 before being transmitted out. PLL circuit 104 "lock" transmitter circuit 102 to the phase of reference clock 106. Accordingly, the data from transmitter circuit 102 that travels through channel interface 115 to IC 120 is locked to the same phase as that of the reference clock 106. The data from IC 110 is received at receiver 122 through input buffer 121. In one embodiment, the data may be a preamble signal from IC 110 that is used to train IC 120. Clock and data recovery circuit (CDR) 125 in receiver circuit 122 may operate at the phase of the preamble signal from IC 110. Once the IC 120 is trained or locked to the phase of the preamble signal, data signals can be transferred to other parts of IC 120 through connection 132. Data from other parts of the IC 120 may be transmitted from other parts of IC 120 to transmitter circuit 128 through connection 134. Transmitter circuit 128, clocked to the reference clock signal from IC 110, is operable to transfer data from IC 120 to IC 110 through output buffer 127 and channel interface 115. IC 110 receives the data from IC 120 through receiver circuit 108 and input buffer 107 coupled to channel interface 115. The data can then be transmitted from receiver circuit 108 to other parts of IC 110 through connection 114.

Figure 2:
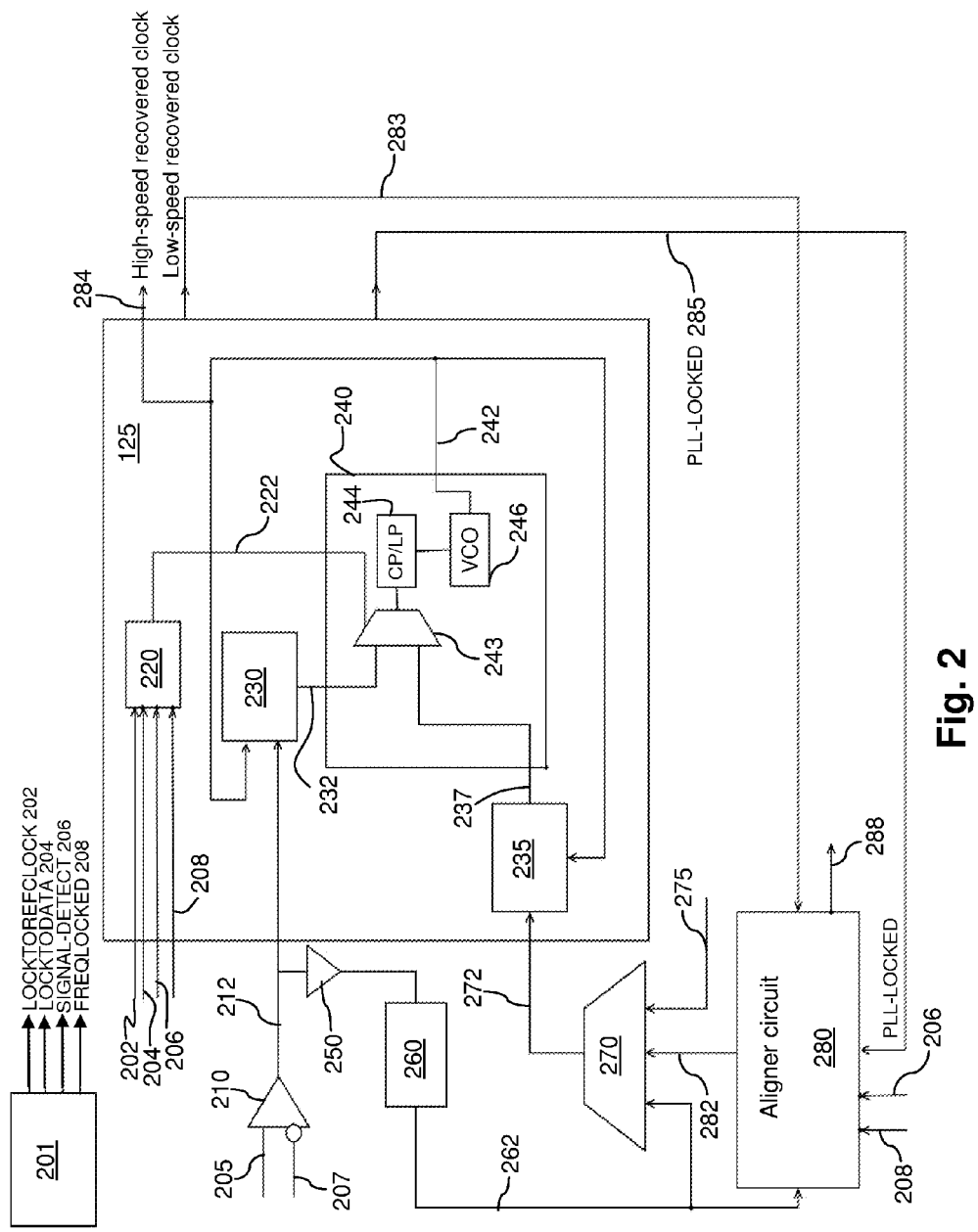
FIG. 2, meant to be illustrative and not limiting, shows a detailed representation of a clock data recovery (CDR) circuit and circuitry operable to train the CDR circuit based on a preamble signal according to one embodiment of the present invention.

FIG. 2, meant to be illustrative and not limiting, shows circuit 200 with a detailed representation of CDR circuit 125 and circuitry operable to train CDR circuit 125 based on a preamble signal according to one embodiment of the present invention. The preamble signal received at receiver circuit 122 of FIG. 1 is received at differential buffer 210. It should be appreciated that the preamble signal is a high-speed serial clock signal and inputs 205 and 207 of differential buffer 210 receive the high-speed differential pair of the preamble signal. In one embodiment, the preamble signal is a clock training pattern. It should be appreciated that a clock training pattern may include a series of predetermined data pattern that is used to lock CDR circuit 125 to a specific clock phase.

Output 212 of differential buffer 210 is coupled to phase detector circuit 230 and buffer 250. It should be appreciated that even though the preamble signal from differential buffer 210 may be transmitted to phase detector circuit 230 and buffer 250, when CDR circuit 125 is being trained with the preamble signal, a signal may be asserted to control the transmission path of the preamble signal within CDR circuit 125. Different signals may be generated by control signal circuitry 201, namely, LOCKTOREFCLOCK 202, LOCKTODATA 204, SIGNAL-DETECT 206, and FREQLOCKED 208. It should be appreciated that signals LOCKTOREFCLOCK 202, LOCKTODATA 204, SIGNAL-DETECT 206 and FREQLOCKED 208 may be active-high or active-low signals. Therefore, in one embodiment, the signals may be active-high signals and the asserted state of the signals may be represented by a logic high level, e.g., 1, and the non-asserted state of the signals may be represented by a logic low level, e.g., 0. In another embodiment, the signals may be active-low signals and the asserted state of the signals may be represented by a logic low level, e.g., 0, and the non-asserted state of the signals may be represented by a logic high level, e.g., 1. In one embodiment, circuit 200 may be part of an IC device and control signal circuitry 201 may be formed by various circuit blocks on the IC device.

As an exemplary embodiment, when CDR circuit 125 is receiving a preamble signal, LOCKTOREFCLOCK signal 202 may be asserted by control signal circuitry 201. Control circuit 220 within CDR circuit 125 may be coupled to receive LOCKTOREFCLOCK signal 202 and may output an appropriate signal through output terminal 222 to control selector circuit 243. Based on the signal at output terminal 222, selector circuit 243 may selectively transmit either output 232 of phase detector circuit 230 or output 237 of phase frequency detector circuit 235 to charge pump and loop filter (CP/LP) circuit 244. It should be appreciated that phase detector circuit 230 and circuit 240 may collectively form a data path in CDR circuit 125 while phase frequency detector circuit 235 and circuit 240 may collectively form a reference clock path in CDR circuit 125. Therefore, depending on the asserted signals, e.g., LOCKTOREFCLOCK 202 and LOCKTODATA 204, CDR circuit 125 may operate in different modes, namely, lock-to-reference mode or lock-to-data mode.

In an exemplary embodiment, when CDR circuit 125 is being trained with a preamble signal, CDR circuit 125 may operate in a lock-to-reference mode. As such, the preamble signal may be transmitted through buffer 250 to divider circuit 260. The preamble signal is divided and converted to parallel clock signal 262 by divider circuit 260. Parallel clock signal 262 is transmitted to switching circuit 270 and aligner circuit block 280. Switching circuit 270 may selectively route parallel clock signal 262 to phase frequency detector circuit 235 through output terminal 272.

It should be appreciated that a phase detector circuit may compare two input signals to produce an output signal based on a phase difference between the two input signals. In one embodiment, phase detector circuit 230 and phase frequency detector circuit 235 may collectively form a PLL circuit with circuit block 240. The output signal from either phase detector circuit 230 or phase frequency detector circuit 235 may be transmitted to CP/LP circuit 244 through selector circuit 243. The output signal may then be low-pass filtered by CP/LP circuit 244 before being transmitted to VCO circuit 246, which in turn generates an output phase. In the embodiment of FIG. 2, the output of VCO circuit 246 is fed back to an input of phase detector circuit 230 and phase frequency detector circuit 235 to form a feedback loop such that input signals received from another component, for instance, from differential buffer 210 and selector circuit 270, are locked to the phase of a previous input or "reference" signal.

In the embodiment of FIG. 2, input 275 of switching circuit 270 may be coupled to a local reference clock. For instance, if CDR circuit 125 is coupled to a local reference clock and does not need to be trained by an external clock, switching circuit 270 may select and transmit the local reference clock coupled to input 275 instead. Therefore, in one embodiment, the PLL circuit formed by phase frequency detector circuit 235 and circuit 240 may be operable to lock CDR circuit 125 to either the phase of parallel clock signal 262 or the local reference clock coupled at input terminal 275 of switching circuit 270.

In an exemplary embodiment, once CDR circuit 125 is locked to the phase of parallel clock signal 262, FREQLOCKED signal 208 may be asserted by control signal circuitry 201 and CDR circuit 125 may generate a lock signal, PLL-LOCKED 285 to indicate that CDR circuit 125 has been locked to the phase of parallel clock signal 262. It should be appreciated that CDR circuit 125 may further generate low-speed recovered clock signal 283 based on parallel clock signal 262 when FREQLOCKED signal 208 is asserted.

Referring still to FIG. 2, low-speed recovered clock signal 283 is routed to aligner circuit block 280. The aligner circuit block 280 may compare and align parallel clock signal 262 with low-speed recovered clock signal 283 from CDR circuit 125. In one embodiment, aligner circuit compares and aligns parallel clock signal 262 and low-speed recovered clock signal 283 when FREQLOCKED signal 208 is at a logic high level and a signal detect signal, SIGNAL-DETECT 206 from control signal circuitry 201 and PLL-LOCKED signal 285 are both at a logic high level. In an exemplary embodiment, SIGNAL-DETECT 206 may be asserted by control signal circuitry 201 when receiver circuit 122 of FIG. 1 receives an active signal from an external component.

After low-speed recovered clock signal 283 has been aligned with parallel clock signal 262, the aligned recovered clock signal is transmitted from aligner circuit block 280 to input 282 of switching circuit 270. Switching circuit 270 may then select and transmit the aligned recovered clock signal coupled at input 282 to CDR circuit 125. Consequently, CDR circuit 125 is locked to the phase of the aligned recovered clock signal transmitted from switching circuit 270.

In an exemplary embodiment, CDR circuit 125 may continue to output low-speed recovered clock signal 283 as long as there is a continuous stream of data, e.g. a preamble signal, a training pattern, etc., received at differential buffer 210. In one embodiment, the continuous low-speed recovered clock signal 283 output from CDR circuit 125 forms a feedback loop that drives CDR circuit 125. After a predefined period of time, e.g., when low-speed recovered clock signal 283 is in a stable state, a training status signal may be generated by aligner circuit block 280 at output terminal 288.

In one embodiment, the training status signal may indicate that low-speed recovered clock signal 283 is ready to be used in CDR circuit 125. In the embodiment of FIG. 1, CDR circuit 125 is part of receiver circuit 122 located on IC 120 and the training status signal may be transmitted from receiver circuit 122 to transmitter circuit 128. Transmitter circuit 128 may then transmit the training status signal to receiver circuit 108 of IC 110 through channel interface 115. In one embodiment, the training status signal may be similar to the preamble signal received at differential buffer 210.

Accordingly, when CDR circuit 125 is being driven by low-speed recovered clock signal 283 that is, after CDR circuit 125 has been trained with the preamble signal, LOCK-TODATA signal 204 may be asserted by control circuitry 201. As explained above, phase detector circuit 230 and circuit 240 may collectively form a data path in CDR circuit 125 when LOCKTODATA signal 204 is asserted. As such, control circuit 220 may receive the asserted LOCKTODATA signal 204 and may selectively transmit signals through the data path of CDR circuit 125.

It should be appreciated that when LOCKTODATA signal 204 is asserted, CDR circuit 125 may operate in a lock-to-data mode and differential buffer 210 may receive data signals instead of a preamble signal from the external component. In one embodiment, data signals from differential buffer 210 are transmitted to phase detector circuit 230 and output signals from phase detector circuit 230 are further transmitted to selector circuit 243 through output terminal 232. Selector circuit 243 then selectively transmits output 232 of phase detector circuit 230 to CP/LP circuit 244.

In an exemplary embodiment, phase detector circuit 230 may be operable to detect and compare the phase of low-speed recovered clock signal 283 with the phase of the data signals received. This ensures that the data signals received from the external component, e.g., IC 110 of FIG. 1, are clocked according to low-speed recovered clock signal 283 that is relatively similar to the reference clock of the external component. It should be appreciated that once CDR circuit 125 has been trained with the preamble signal, a serial clock signal, e.g., high-speed recovered clock signal 284, may also be generated by CDR circuit 125 and transmitted to IC 110 of FIG. 1 through transmitter circuit 128. High-speed recovered clock signal 284 may be used to clock high-speed serial data transmission from IC 120 of FIG. 1 to IC 110.

Figure 3:
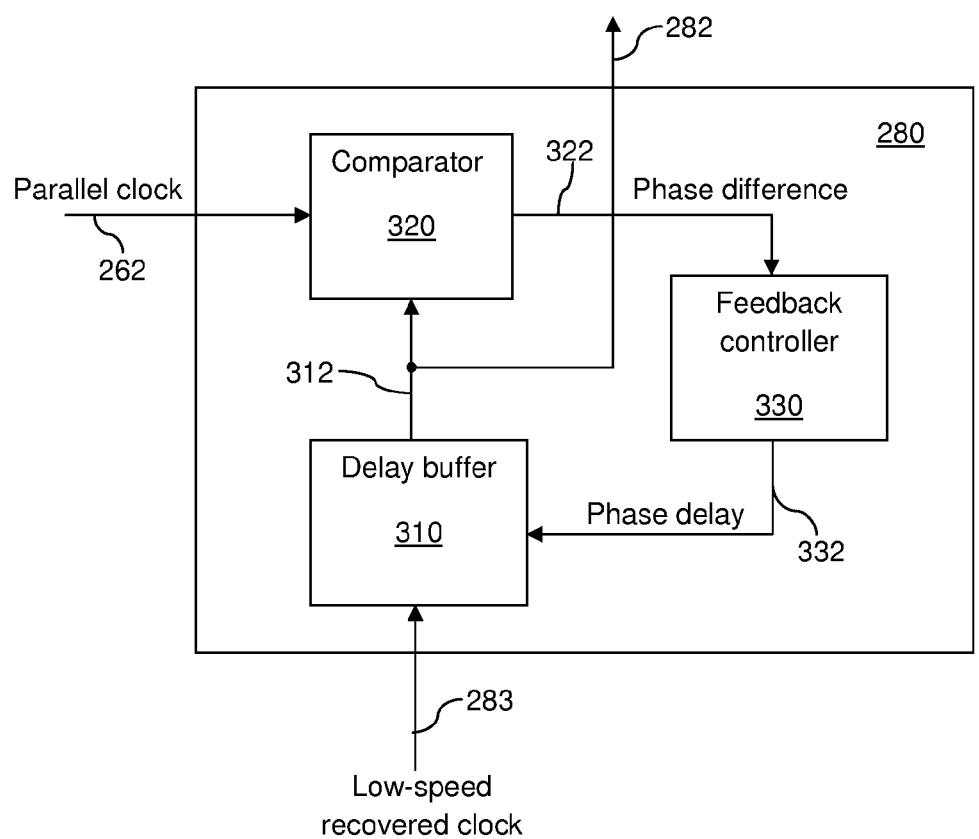
FIG. 3, meant to be illustrative and not limiting, shows a more detailed representation of an aligner circuit block according to one embodiment of the present invention.

FIG. 3, meant to be illustrative and not limiting, shows a more detailed representation of aligner circuit block 280 according to one embodiment of the present invention. In the illustrative embodiment of FIG. 2, aligner circuit block 280 receives parallel clock signal 262 and low-speed recovered clock signal 283 from divider circuit 260 and CDR 125 respectively. Initially, when aligner circuit block 280 first receives low-speed recovered clock signal 283 at delay buffer circuit 310, no delay is applied to low-speed recovered clock signal 283.

Output 312 of delay buffer circuit 310 —at this point, output 312 may transmit the unaltered low-speed recovered clock signal 283 —is coupled to comparator circuit 320. Comparator circuit 320 receives parallel clock signal 262 and compares the received parallel clock signal 262 with the delayed low-speed recovered clock signal at output 312 of delay buffer circuit 310. The phase difference, if any, between the two signals, i.e., parallel clock signal 262 and delayed low-speed recovered clock signal 283 at output 312, is transmitted from output 322 of comparator circuit 320 to feedback controller circuit 330. Based on the phase difference, feedback controller circuit 330 generates a phase delay signal 332 and transmits the phase delay signal 332 to the delay buffer circuit 310.

Referring still to FIG. 3, delay buffer circuit 310 receives the phase delay signal 332 and receives the low-speed recovered clock signal 283. The delay buffer circuit 310 applies the phase delay of the phase delay signal 332 to the low-speed recovered clock signal 283 to generate a delayed low-speed recovered signal at output 312. The delayed low-speed recovered signal at output 312 is transmitted to comparator circuit 320. Accordingly, comparator circuit 320 may once again compare the delayed low-speed recovered clock signal from output 312 with parallel clock signal 262 and transmit the phase difference between the two signals, if any, back to feedback controller circuit 330 through output 322 of comparator circuit 320.

Feedback controller circuit 330 may then generate a subsequent phase delay signal 332 based on the phase difference between the two signals, i.e., parallel clock signal 262 and delayed low-speed recovered clock signal, and transmit phase delay signal 332 back to delay buffer circuit 310. In an exemplary embodiment, the process may be performed multiple times and low-speed recovered clock signal 283 may be continuously adjusted until the phase of low-speed recovered clock signal 283 aligns with the phase of parallel clock signal 262. The aligned low-speed recovered clock signal may then be transmitted from aligner circuit block 280 to switching circuit 270 of FIG. 2 through output 282.

Figure 4:
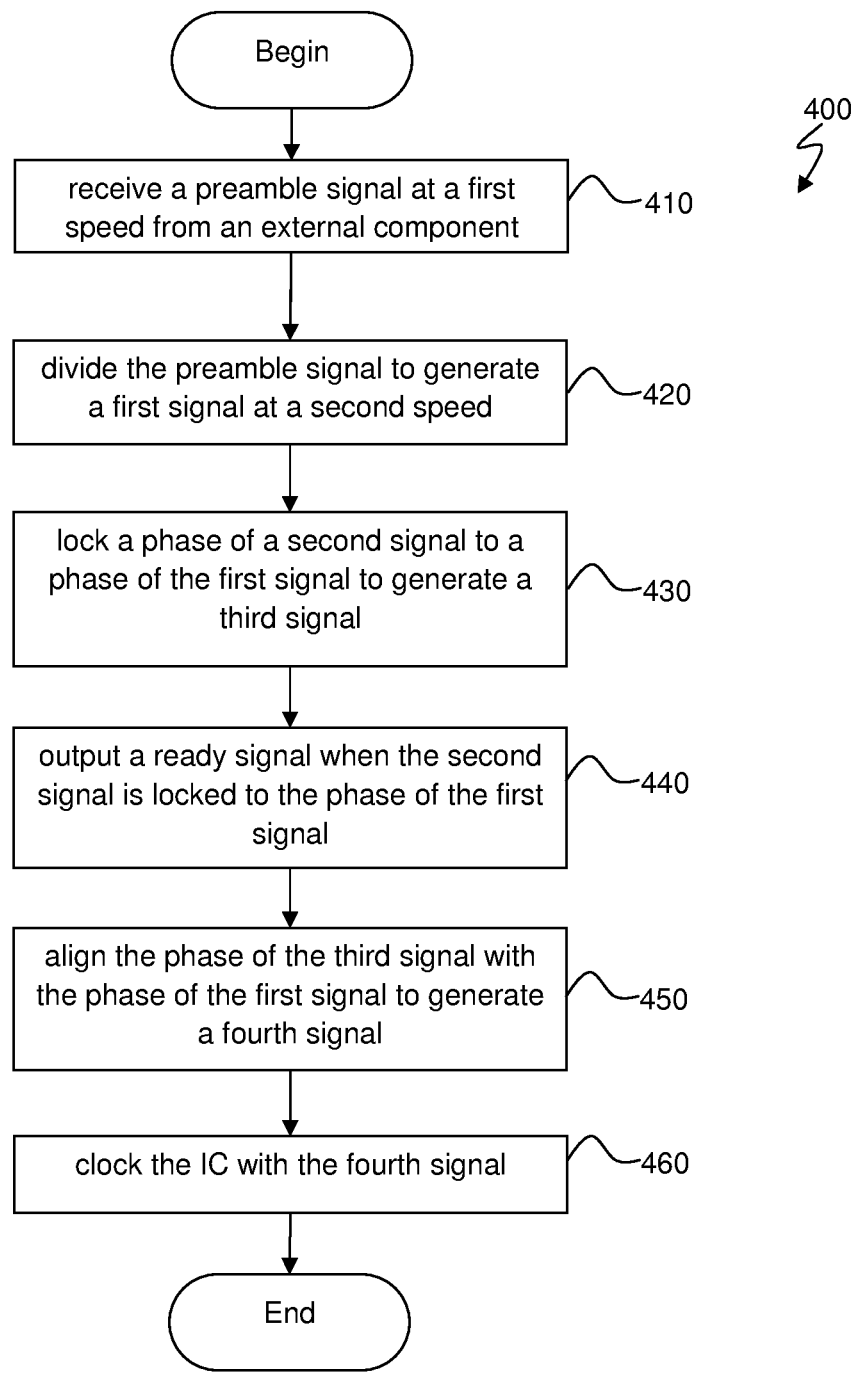
FIG. 4, meant to be illustrative and not limiting, shows a method flow for operating an IC according to one embodiment of the present invention.

FIG. 4, meant to be illustrative and not limiting, shows method flow 400 for operating an IC according to one embodiment of the present invention. Flow 400 begins by receiving a preamble signal at a first speed from an external component at step 410. In one embodiment, the preamble signal may be a high-speed serial clock signal received from the external component that may be used to train the IC. The preamble signal is divided at step 420 to generate a first signal at a second speed. In an exemplary embodiment, the preamble signal may be a serial clock signal and the division of the preamble signal converts the preamble signal to a parallel clock signal. In the embodiment of FIG. 2, the high-speed serial clock signal or the preamble signal received at differential buffer 210 is converted to parallel clock signal 262 by divider circuit 260.

At step 430, a phase of a second signal is locked to a phase of the first signal that is generated at step 420 to generate a third signal. In one embodiment, the second signal may be a clock signal within a recovery circuit similar to recovery circuit 125 of FIG. 2 and the third signal may be a recovered clock similar to low-speed recovered clock 283 of FIG. 2. At step 440, a ready signal may be generated by the IC when the second signal is locked to the phase and frequency of the first signal. The phase of the third signal is aligned with the phase of the first signal at step 450 to form a fourth signal. The IC is clocked with the fourth signal at step 460. In one embodiment, the fourth signal is a clock signal that is transmitted to a recovery circuit in the IC. The IC may further generate another ready signal when the recovery circuit in the IC receives the fourth signal. In one embodiment, the ready signal may be transmitted to the external component to indicate that the IC is ready to receive actual data streams from the external component.

Figure 5:
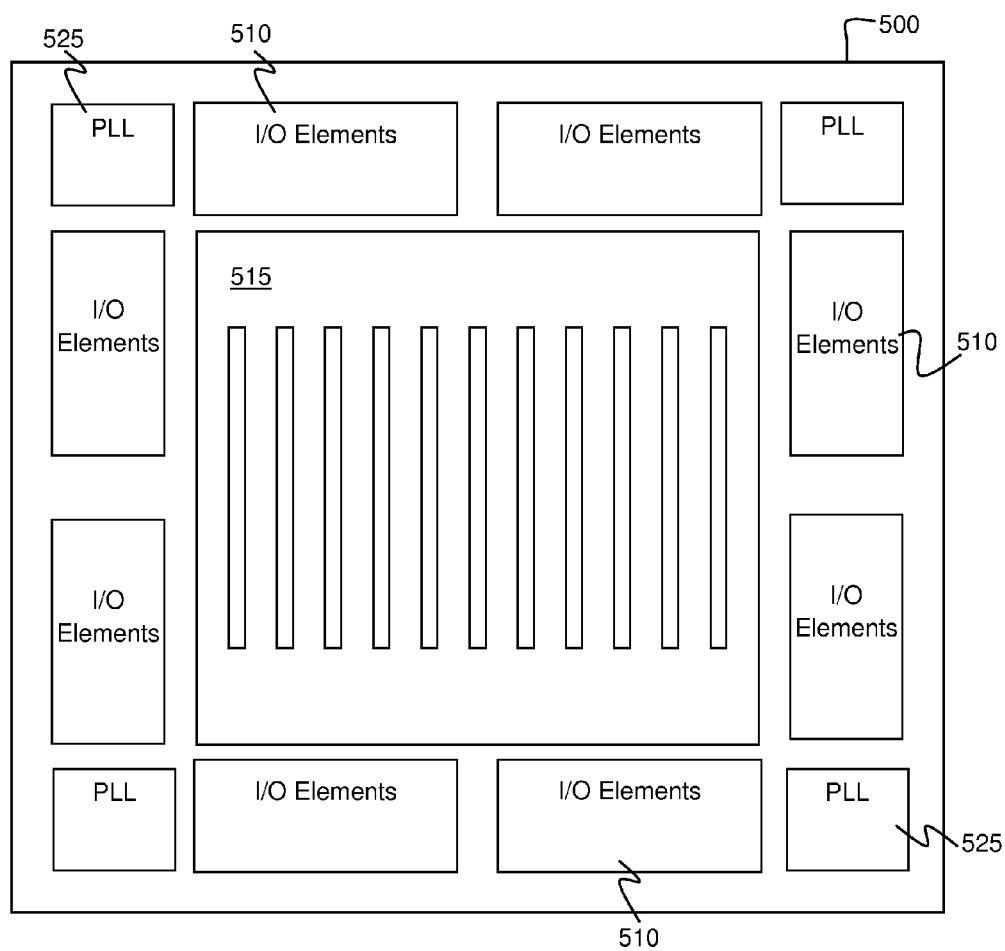
FIG. 5, meant to be illustrative and not limiting, shows a simplified block diagram of a programmable logic device (PLD) that can include aspects of the present embodiments.

FIG. 5, meant to be illustrative and not limiting, shows a simplified block diagram of PLD 500 that can include aspects of the present invention. Programmable device 500 includes logic region 515 and I/O elements 510. I/O elements 510 may support a variety of memory interfaces. Other auxiliary circuits such as phase-locked loops (PLLs) 525 for clock generation and timing, can be located outside the core logic region 515, e.g., at corners of programmable device 500 and adjacent to I/O elements 510.

Referring still to FIG. 5, logic region 515 may be populated with logic cells which include, among other things, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Other components, e.g., another PLD, a circuit, etc., may be connected to PLD 500 through I/O elements 510. In the embodiment of FIG. 1, ICs 110 and 120 may be similar to PLD 500 and ICs 110 and 120 are connected to each other through I/O elements 510 that may include transceiver circuitry that includes, among others, receiver circuits 122 and 108 and transmitter circuits 102 and 128.

The embodiments, thus far, were described with respect to integrated circuits. The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit comprising:
    a divider circuit operable to receive a first signal at a first speed and output a second signal at a second speed based on the first signal;
    a recovery circuit coupled to the divider circuit, wherein the recovery circuit is operable to determine the frequency of the second signal and is further operable to generate a first ready signal and a recovered clock signal based on the second signal; and
    a phase aligner circuit coupled to the recovery circuit, the phase aligner circuit having the second signal as an input, wherein the phase aligner circuit is operable to align a phase of the second signal with a phase of the recovered clock signal based on the first ready signal.

2. The circuit of claim 1, wherein the recovery circuit comprises a phase-locked loop (PLL) circuit operable to lock the phase of the recovered clock signal to a phase of the second signal.

3. The circuit of claim 1, wherein the circuit is a clock data recovery (CDR) circuit coupled to an external circuit, and wherein the first signal is a clock signal that is received from the external circuit.

4. The circuit of claim 1, wherein the first signal is a serial clock signal, and wherein the second signal is a parallel clock signal.

5. The circuit of claim 1 further comprises a transmitter circuit operable to transmit a second ready signal to an external circuit.

6. The circuit of claim 5, wherein the second ready signal is similar to the first signal.

7. The circuit of claim 1 further comprising:
a switching circuit having a first input coupled to the recovery circuit and a second input coupled to the phase aligner circuit, wherein the switching circuit is operable to transmit signals from one of the first input or the second input based on the first ready signal.

8. The circuit of claim 1, wherein the phase aligner circuit includes a delay buffer, a comparator, and a feedback controller.

9. The circuit of claim 8, wherein the feedback controller receives an output of the comparator and transmits a signal to the delay buffer.

10. The circuit of claim 1, wherein the phase aligner circuit compares the second signal to a recovered clock signal.

11. A method of operating an integrated circuit (IC) comprising:
receiving a preamble signal at a first speed from an external component;
dividing the preamble signal to generate a first signal at a second speed;
locking a phase of a second signal to a phase of the first signal to generate a third signal, wherein the second signal is generated within a recovery circuit in the IC;
aligning a phase of the third signal with the phase of the first signal, via an aligner having the first signal as an input; and
clocking the IC with the aligned third signal.

12. The method of claim 11, wherein the aligning comprises:
determining a phase difference between the first signal and the third signal; and
applying a delay to the third signal based on the phase difference.

13. The method of claim 11, wherein the preamble signal is a serial clock signal, and wherein the dividing the preamble signal comprises:
converting the serial clock signal to a parallel clock signal to generate the first signal.

14. The method of claim 11 further comprising:
outputting a ready signal after the IC is clocked with the aligned third signal; and
receiving a data stream from the external component after the clocking.

15. The method of claim 14, wherein the outputting the ready signal comprises:
transmitting the preamble signal from the IC to the external component.

16. The method of claim 11 further comprising:
placing the IC in a first operating mode prior to the clocking; and
placing the IC in a second operating mode prior to the receiving the data stream from the external component, wherein the first operating mode is operable to route the first and third signals through a first path in the recovery circuit in the IC, and wherein the second operating mode is operable to route the data stream through a second path in the recovery circuit.

17. The method of claim 11, wherein the receiving the preamble signal comprises:
receiving a training pattern from the external component, and wherein the IC is clocked based on the training pattern.

18. The method of claim 11, further comprising:
determining a frequency of the second signal.

19. The method of claim 11, wherein the preamble signal is a differential signal.

20. The method of claim 11, wherein the preamble signal is received through a differential buffer.

* * * * *